United States Patent
Noguchi (10) Patent No.: US 11,489,040 B2
(45) Date of Patent: Nov. 1, 2022

(54) SILICON CARBIDE SEMICONDUCTOR DEVICE AND METHOD FOR MANUFACTURING THE SAME

(71) Applicant: Mitsubishi Electric Corporation, Tokyo (JP)

(72) Inventor: Tomoaki Noguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 11 days.

(21) Appl. No.: 17/021,958

(22) Filed: Sep. 15, 2020

(65) Prior Publication Data
US 2021/0296433 A1    Sep. 23, 2021

(30) Foreign Application Priority Data
Mar. 19, 2020    (JP) .............................. JP2020-049005

(51) Int. Cl.
| H01L 29/04 | (2006.01) |
| H01L 29/66 | (2006.01) |
| H01L 29/16 | (2006.01) |
| H01L 21/66 | (2006.01) |

(52) U.S. Cl.
CPC .............. *H01L 29/04* (2013.01); *H01L 22/12* (2013.01); *H01L 29/1608* (2013.01); *H01L 29/66068* (2013.01)

(58) Field of Classification Search
None
See application file for complete search history.

(56) References Cited

FOREIGN PATENT DOCUMENTS

| DE | 112017005529 T5 | * | 1/2020 |
| JP | 2012244083 A | | 12/2012 |

* cited by examiner

*Primary Examiner* — Jack S Chen
(74) *Attorney, Agent, or Firm* — Studebaker & Brackett PC (57) ABSTRACT

A silicon carbide semiconductor device includes: a silicon carbide layer of a first conductive type including a defect region in which a crystal defect exists; a plurality of well regions of a second conductive type formed on the silicon carbide layer; source regions of the first conductive type formed in the well regions; gate oxide films formed on the silicon carbide layer, the well regions and the source regions; gate electrodes formed on the gate oxide films; and a source electrode electrically connected to the well regions and the source regions, wherein the source region is not formed in the defect region.

5 Claims, 7 Drawing Sheets

SILICON CARBIDE SEMICONDUCTOR DEVICE AND METHOD FOR MANUFACTURING THE SAME

BACKGROUND OF THE INVENTION

Field

The present disclosure relates to a silicon carbide semiconductor device and a method for manufacturing the same.

Background

A silicon carbide crystal is promising as a material of a next-generation switching device which can realize high voltage resistance, low loss and high-temperature operation (see, for example, JP 2012-244083 A).

SUMMARY

However, a silicon carbide crystal involves a number of crystal defects such as a stacking fault. In a conventional silicon carbide semiconductor device, there is a problem in that as a result of a leak current occurring due to a crystal defect in a wafer or a crystal defect occurring upon epitaxial growth, a yield degrades.

The present disclosure has been made to solve the problem as described above, and an object of the present disclosure is to obtain a silicon carbide semiconductor device which can improve a yield, and a method for manufacturing the same.

A silicon carbide semiconductor device according to the present disclosure includes: a silicon carbide layer of a first conductive type including a defect region in which a crystal defect exists; a plurality of well regions of a second conductive type formed on the silicon carbide layer; source regions of the first conductive type formed in the well regions; gate oxide films formed on the silicon carbide layer, the well regions and the source regions; gate electrodes formed on the gate oxide films; and a source electrode electrically connected to the well regions and the source regions, wherein the source region is not formed in the defect region.

In the present disclosure, the source region is not formed in the defect region. If the source region is not formed, because a transistor is not turned on even if a voltage is applied to the gate electrode, a leak current does not occur. As a result, it is possible to improve a yield.

Other and further objects, features and advantages of the invention will appear more fully from the following description.

DESCRIPTION OF EMBODIMENTS

A silicon carbide semiconductor device and a method for manufacturing the same according to the embodiments of the present disclosure will be described with reference to the drawings. The same components will be denoted by the same symbols, and the repeated description thereof may be omitted.

First Embodiment

Figure 1:
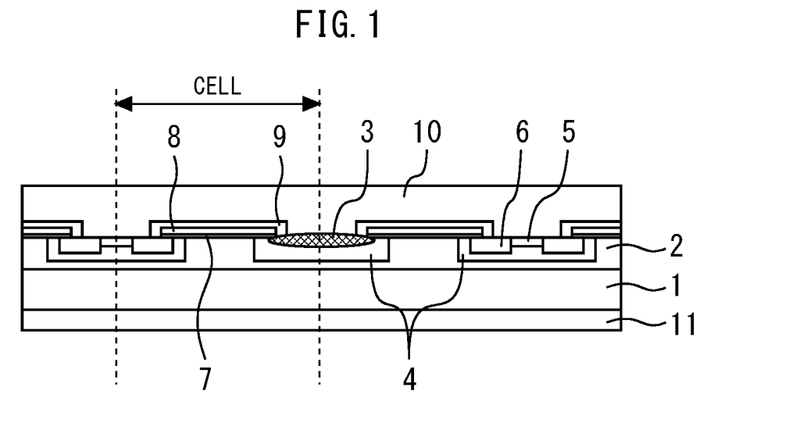
FIG. 1 is a cross-sectional view illustrating a silicon carbide semiconductor device according to a first embodiment.

FIG. 1 is a cross-sectional view illustrating a silicon carbide semiconductor device according to a first embodiment. In the following description, unless otherwise described, a semiconductor device means a MOSFET (Metal Oxide Semiconductor Field Effect Transistor). An N-type silicon carbide layer 2 is epitaxially grown on a silicon carbide substrate 1. The silicon carbide layer 2 includes a defect region 3 in which a crystal defect exists. A plurality of P-type well regions 4 are formed on the silicon carbide layer 2. P-type contact regions 5 and N-type source regions 6 are formed in the well regions 4. Note that the P-type contact regions 5 do not have to be provided.

Gate oxide films 7 are formed on the silicon carbide layer 2, the well regions 4 and the source regions 6. Gate electrodes 8 are formed on the gate oxide films 7. The gate electrodes 8 are covered with interlayer dielectrics 9 such as thermal oxide films. A source electrode 10 is formed on the silicon carbide layer 2 and the interlayer dielectrics 9 and is electrically connected to the P-type contact regions 5 and the source regions 6. A drain electrode 11 is formed on a lower surface of the silicon carbide substrate 1. A plurality of cells of the MOSFET are formed in the silicon carbide layer 2 in this manner. As a feature of the present embodiment, the source region 6 is not formed in the defect region 3.

Figure 2:
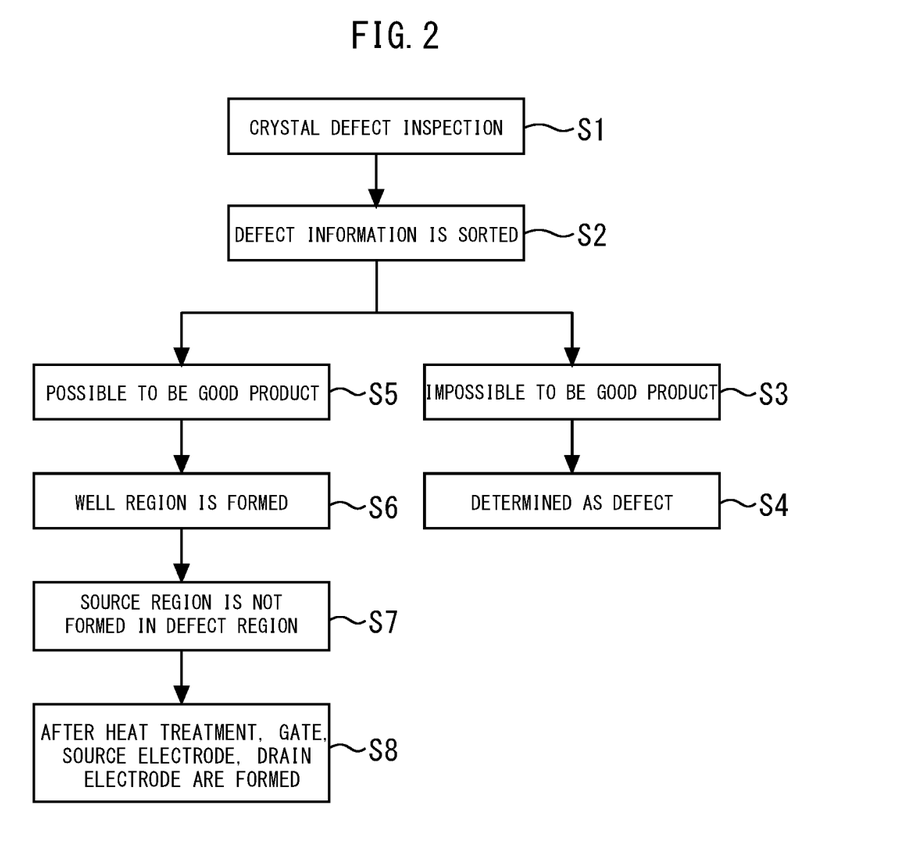
FIG. 2 is a flowchart of a method for manufacturing the silicon carbide semiconductor device according to the first embodiment.

Subsequently, a method for manufacturing the silicon carbide semiconductor device according to the present embodiment will be described. FIG. 2 is a flowchart of the method for manufacturing the silicon carbide semiconductor device according to the first embodiment.

Figure 3:
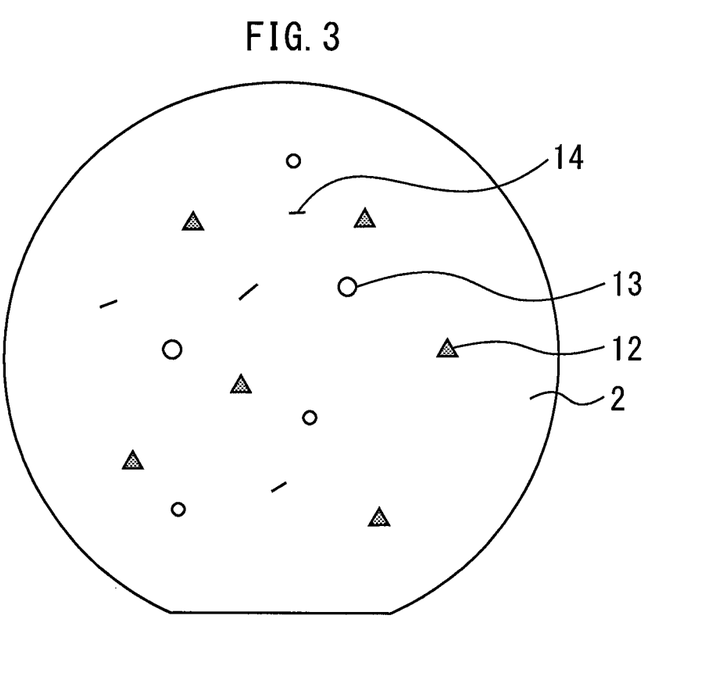
FIG. 3 is a plan view illustrating a silicon carbide wafer after epitaxial growth.

First, a crystal defect of the silicon carbide layer 2 which has been epitaxially grown on the silicon carbide substrate 1 is inspected (step S1). FIG. 3 is a plan view illustrating a silicon carbide wafer after epitaxial growth. The epitaxially grown silicon carbide layer 2 includes a plurality of crystal defects such as, mainly, a triangle defect 12, a downfall defect 13 and a carrot defect 14.

Figure 4:
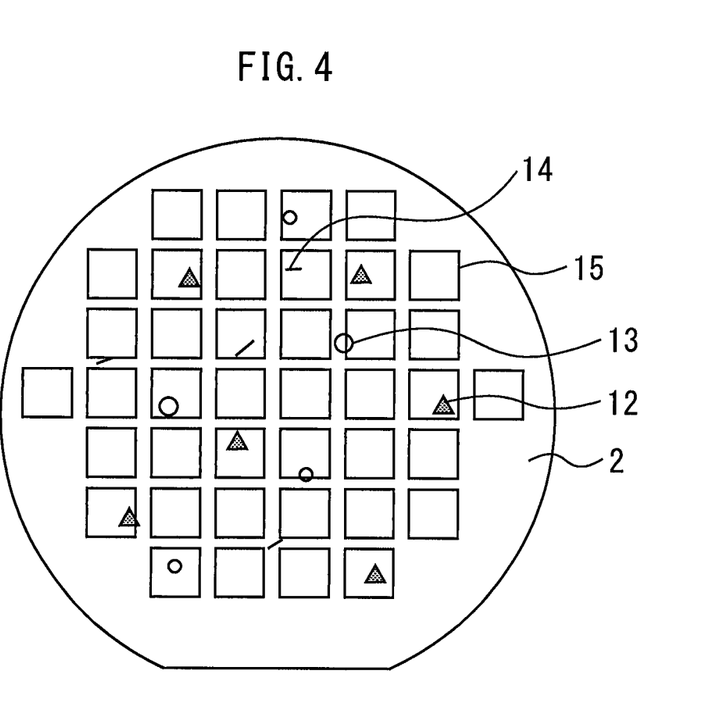
FIG. 4 is a plan view illustrating a state where a region in which an active region is to be formed in the silicon carbide wafer is specified.
Figure 5:
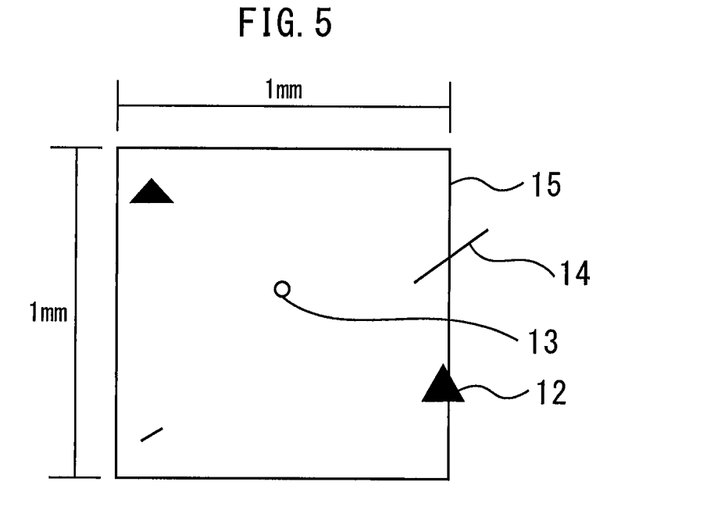
FIG. 5 is an enlarged plan view illustrating crystal defects included in each chip.
Figure 6:
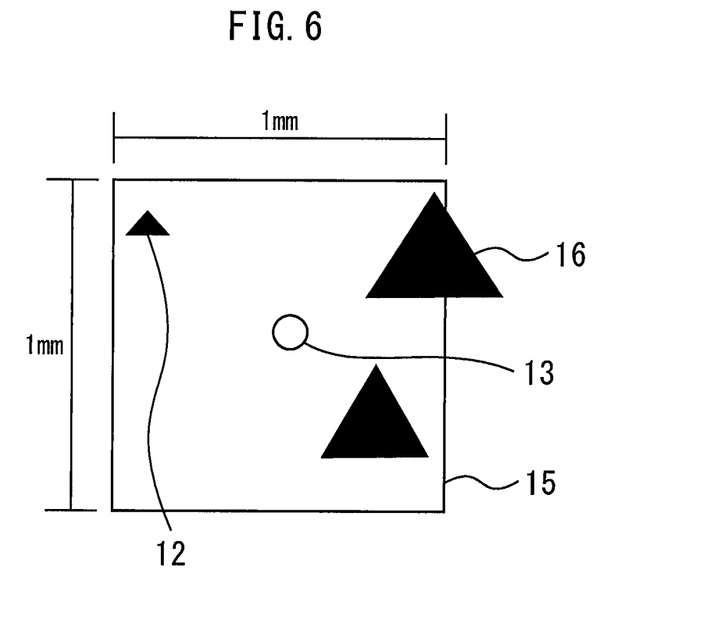
FIG. 6 is an enlarged plan view illustrating crystal defects included in each chip.

FIG. 4 is a plan view illustrating a state where a region in which an active region is to be formed in the silicon carbide wafer is specified. The active region is a region which actually operates as a MOSFET chip in the completed semiconductor device. A region 15 in which an active region is to be formed in the future in the silicon carbide wafer is specified, and information regarding a crystal defect in the region 15 is acquired. As the information of the crystal defect, a size, coordinates and a shape of the crystal defect can be acquired at the same time by using, for example, a SiC wafer defect inspection and review system (SICA) manufactured by Lasertec Corporation. FIG. 5 and FIG. 6 are enlarged plan views illustrating crystal defects included in each chip. While a crystal defect exceeding 100 µm does not exist in FIG. 5, a crystal defect 16 exceeding 100 µm exists in FIG. 6.

Then, defect information is sorted (step S2). A chip having the crystal defect 16 exceeding 100 µm is determined as being impossible to be improved to be a good product even if the present embodiment is applied (step S3), and determined as a defect (step S4). Meanwhile, a chip including a crystal defect equal to or less than 100 µm is determined as being possible to be improved to be a good product regardless of a shape and the number of crystal defects (step S5). Concerning the chip determined as being possible to be improved to be a good product, a position of the defect region 3 in which the crystal defect exists is specified.

Figure 7:
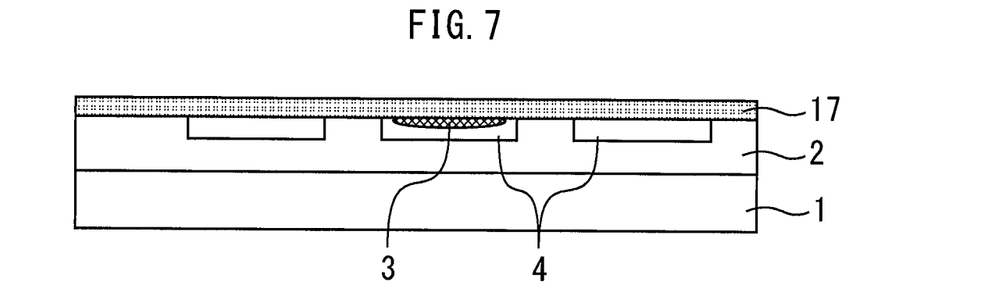
FIG. 7 is a cross-sectional view illustrating the method for manufacturing the silicon carbide semiconductor device according to the first embodiment.

FIG. 7 to FIG. 10 are cross-sectional views illustrating the method for manufacturing the silicon carbide semiconductor device according to the first embodiment. First, as illustrated in FIG. 7, a plurality of well regions 4 are formed on the silicon carbide layer 2 through photoengraving process and injection of aluminum (Al) (step S6). A negative resist 17 is applied on an entire upper surface of the silicon carbide layer 2.

Figure 8:
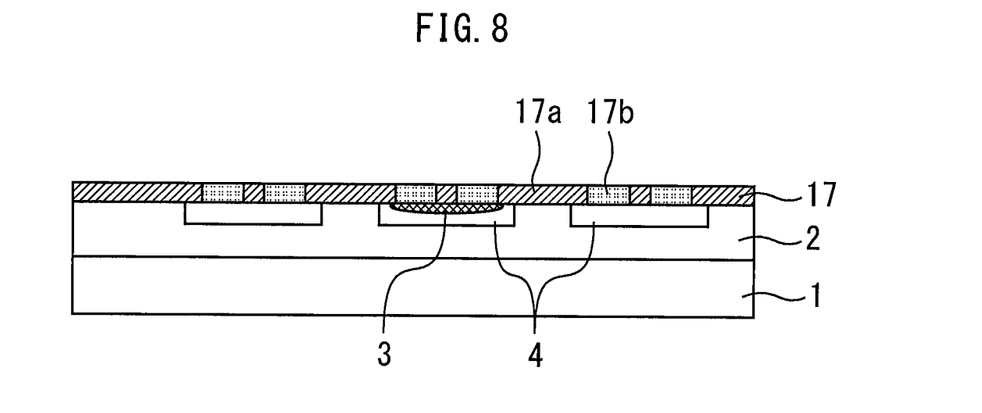
FIG. 8 is a cross-sectional view illustrating the method for manufacturing the silicon carbide semiconductor device according to the first embodiment.

Here, a normal mask for exposing the negative resist 17 for forming the source region 6 is a mask which covers a region in which the source region 6 is to be formed in each well region 4 and which is open in other regions. As illustrated in FIG. 8, the negative resist 17 is exposed using this normal mask. By this means, the negative resist 17 outside the region in which the source region 6 is to be formed is exposed and activated. In the drawings, a portion where the negative resist 17 is activated is indicated as 17a, and a portion where the negative resist 17 is not activated is indicated as 17b.

Figure 9:
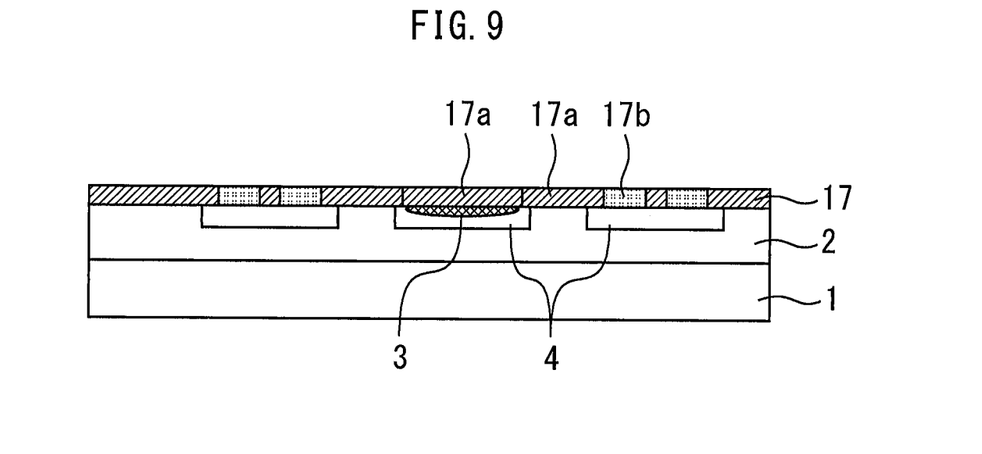
FIG. 9 is a cross-sectional view illustrating the method for manufacturing the silicon carbide semiconductor device according to the first embodiment.

Then, as illustrated in FIG. 9, the negative resist 17 in the defect region 3 whose position is specified in advance is locally exposed with laser and activated using local laser exposure machine. The local laser exposure machine is a commercially available apparatus which can perform local exposure of nm order.

Figure 10:
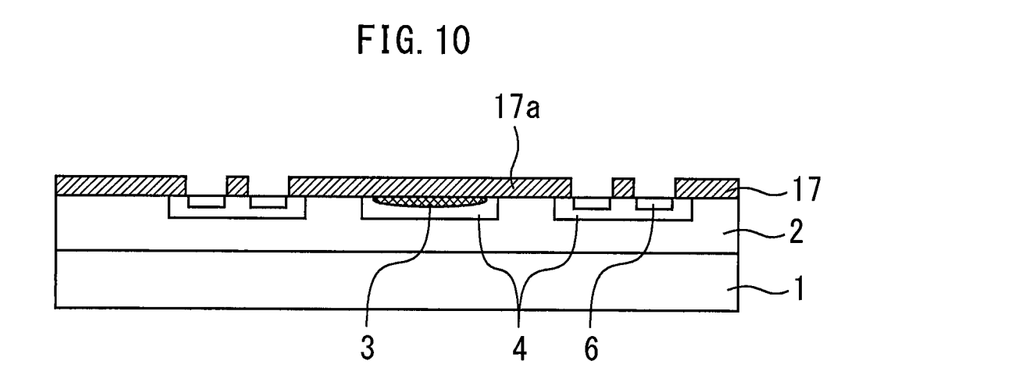
FIG. 10 is a cross-sectional view illustrating the method for manufacturing the silicon carbide semiconductor device according to the first embodiment.

Then, as illustrated in FIG. 10, the negative resist 17 which has been exposed and which has been exposed with laser is developed, and the portion 17b of the negative resist 17 which is not activated is removed while the portion 17a which is activated is left. By this means, an opening is formed in the region in which the source region 6 is to be formed outside the defect region 3, so that it is possible to leave the negative resist 17 in the defect region 3. The source regions 6 are formed in the well regions 4 by injecting nitrogen (N) into the well regions 4 as impurities using the developed negative resist 17 as a mask. At this time, the source region 6 is not formed in the defect region 3 in which the negative resist 17 is left (step S7). Thereafter, the negative resist 17 is removed.

Then, the well regions 4 and the source regions 6 are activated through heat treatment at a high temperature. Thereafter, the gate oxide films 7, the gate electrodes 8, the source electrode 10, the drain electrode 11, or the like, are formed (step S8). The silicon carbide semiconductor device according to the present embodiment is manufactured through the above-described process.

Figure 11:
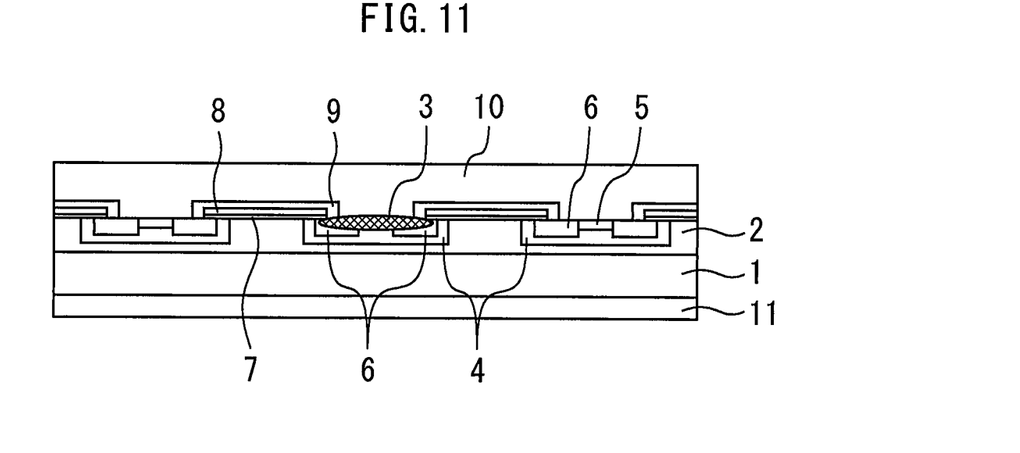
FIG. 11 is a cross-sectional view illustrating a silicon carbide semiconductor device according to a comparative example.

Subsequently, effects of the present embodiment will be described through comparison with a comparative example. FIG. 11 is a cross-sectional view illustrating a silicon carbide semiconductor device according to the comparative example. In the comparative example, the source regions 6 are also formed in the defect region 3. In the defect region 3, because crystal orientation is disordered, the gate oxide film 7 becomes unformed, and as a result of the gate electrode 8 contacting the silicon carbide layer 2, current leakage occurs. Further, if there is a dent in the silicon carbide layer 2, current leakage occurs between the source and the drain.

In contrast, in the present embodiment, the source region 6 is not formed in the defect region 3. If the source region 6 is not formed, because a transistor is not turned on even if a voltage is applied to the gate electrode 8, a leak current does not occur. As a result, it is possible to improve a yield.

Note that it is possible to prevent occurrence of a leak current in a similar manner also in a case where the defect region 3 exists across a plurality of cells as well as existing in one cell. While electrons do not flow in a cell in which the source region 6 is not formed, because a chip includes equal to or more than several tens of thousands of cells, even if electrons do not flow in several cells, influence is small.

Further, in a case where the defect region 3 exists in one of two regions in which the source regions 6 are to be formed included in one well region 4, both source regions 6 are not formed. However, to prevent degradation of characteristics, it is preferable not to form only the source region 6 in which the defect region 3 exists.

Second Embodiment

Figure 12:
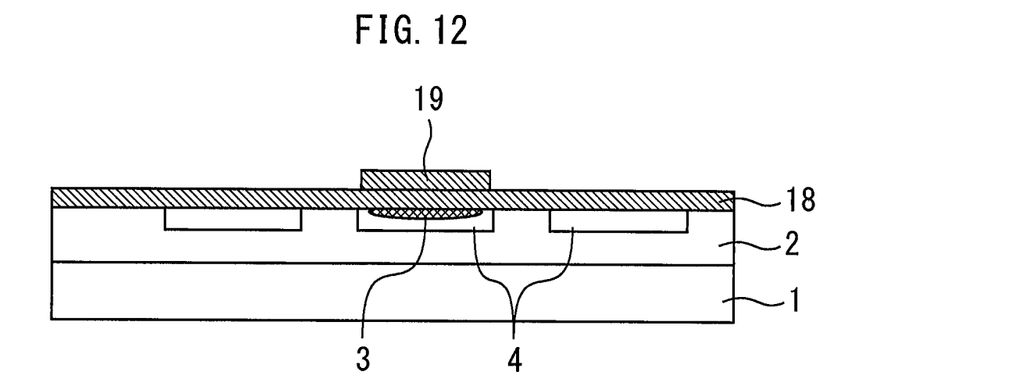
FIG. 12 is a cross-sectional view illustrating a method for manufacturing a semiconductor device according to a second embodiment.
Figure 13:
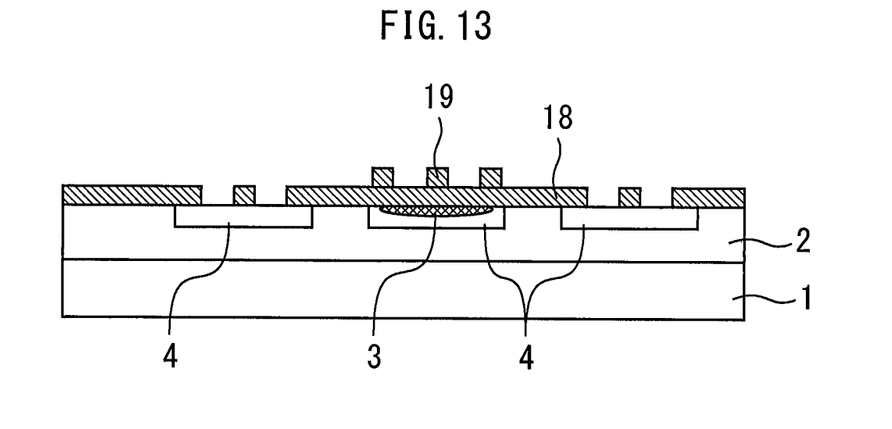
FIG. 13 is a cross-sectional view illustrating a method for manufacturing a semiconductor device according to a second embodiment.

FIG. 12 and FIG. 13 are cross-sectional views illustrating a method for manufacturing a semiconductor device according to a second embodiment. In a similar manner to the first embodiment, a crystal defect is inspected, and the well regions 4 are formed. Then, as illustrated in FIG. 12, a first positive resist 18 is applied on the entire upper surface of the silicon carbide layer 2. Then, in the defect region 3, a second positive resist 19 is formed on the first positive resist 18 through inkjet application. As an inkjet applicator, a commercially available apparatus which can perform local photoresist application with a radius of several micrometers is used.

Then, as illustrated in FIG. 13, the first and the second positive resists 18 and 19 in the region where the source regions 6 are to be formed are exposed and developed. Then, the source regions 6 are formed by injecting N into the well regions 4 using the developed first and second positive resists 18 and 19 as a mask.

Here, a thickness of the second positive resist 19 is the same as a thickness of the first positive resist 18. Therefore, a resist having a thickness which is double a normal thickness is applied to the defect region 3. Therefore, the first positive resist 18 which is located below the second positive resist 19 is not exposed, and the developed first positive resist 18 is left in the defect region 3. Accordingly, because the source region 6 is not formed in the defect region 3 even if N is injected, it is possible to obtain effects similar to those of the first embodiment. Other configurations and effects are similar to those of the first embodiment.

Third Embodiment

In a similar manner to the first embodiment, a crystal defect is inspected, and the well regions 4 are formed. Then, a resist is applied on the entire upper surface of the silicon carbide layer 2. In a similar manner to FIG. 10, the source regions 6 are formed by injecting N into the well regions 4 using the exposed and developed resist as a mask. Here, in the present embodiment, the resist is exposed using a commercially available mask-less exposure machine. Normal mask data for forming the source regions 6 and mask data in which a position of the defect region 3 is aligned are generated and prepared for each wafer using the mask-less exposure machine. Then, the resist is exposed on the basis of the mask data generated by the mask-less exposure machine so that the developed resist is left in the defect region 3. Therefore, even if impurities are injected, because the source region 6 is not formed in the defect region 3, it is possible to obtain effects similar to those of the first embodiment. Other configurations and effects are similar to those of the first embodiment. Note that the resist to be used for exposure by the mask-less exposure machine may be either a positive resist or a negative resist. Further, exposure may be performed either in units of chip or in units of wafer.

Fourth Embodiment

Figure 14:
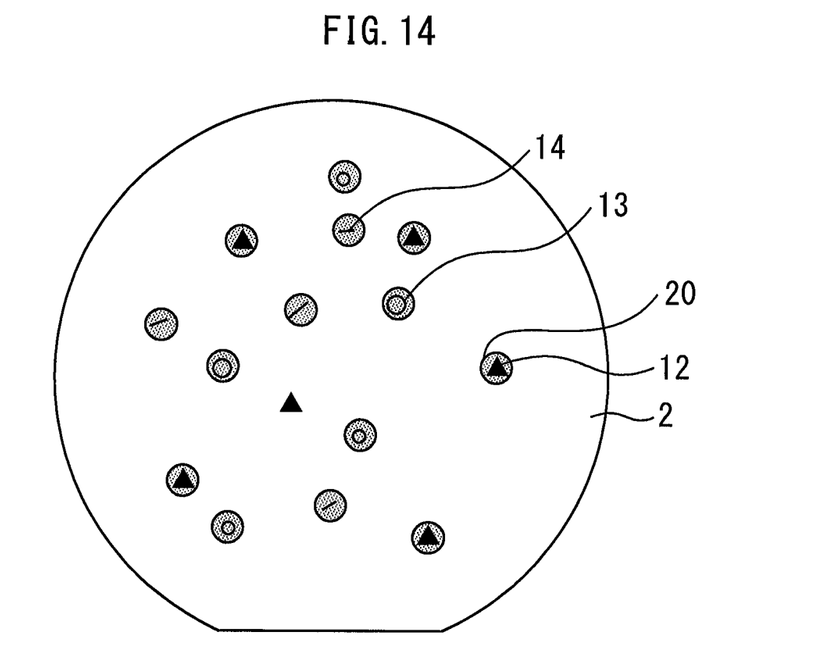
FIG. 14 is a plan view illustrating a method for manufacturing a semiconductor device according to a fourth embodiment.
Figure 15:
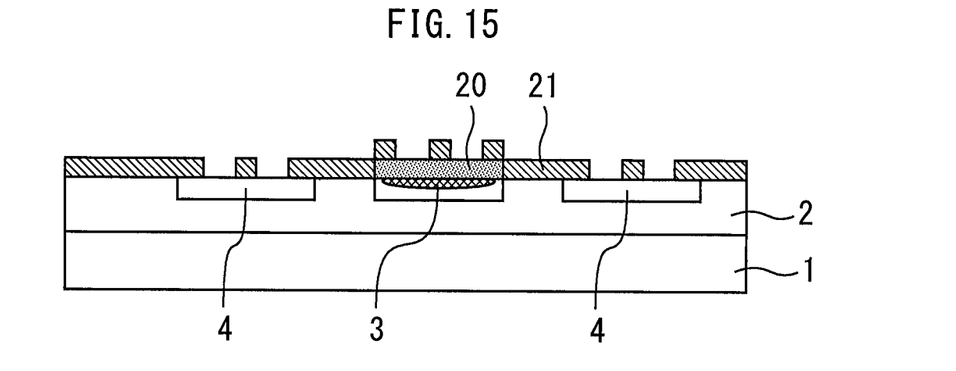
FIG. 15 is a cross-sectional view illustrating the method for manufacturing the semiconductor device according to the fourth embodiment.

FIG. 14 is a plan view illustrating a method for manufacturing a semiconductor device according to a fourth embodiment. FIG. 15 is a cross-sectional view illustrating the method for manufacturing the semiconductor device according to the fourth embodiment. In a similar manner to the first embodiment, a crystal defect is inspected, and the well regions 4 are formed. Then, an insulating film 20 such as a nitride film or an oxide film is formed on the entire upper surface of the silicon carbide layer 2 through CVD. While a thickness of the insulating film 20 is approximately 2 µm, the thickness may be equal to or greater than 2 µm. Then, a resist is applied on the entire surface, and the resist above the defect region 3 is left through exposure and development. After the insulating film 20 is etched using this resist as a mask, the resist is removed. By this means, as illustrated in FIG. 14, the insulating film 20 is left above the defect region 3.

Then, a resist is applied on the entire upper surface of the silicon carbide layer 2, and normal mask exposure is performed. By this means, as illustrated in FIG. 15, a resist pattern 21 in which regions where the source regions 6 are to be formed are respectively open in a plurality of well regions 4 is formed. Then, the source regions 6 are formed by injecting N into the well regions 4 using the resist pattern 21 and the insulating film 20 as a mask. Because impurities are not injected into a portion where the insulating film 20 is formed, the source region 6 is not formed in the defect region 3. Therefore, it is possible to obtain effects similar to those of the first embodiment. Other configurations and effects are similar to those of the first embodiment. Note that the resist pattern 21 may be either a positive resist pattern or a negative resist pattern.

Fifth Embodiment

Figure 16:
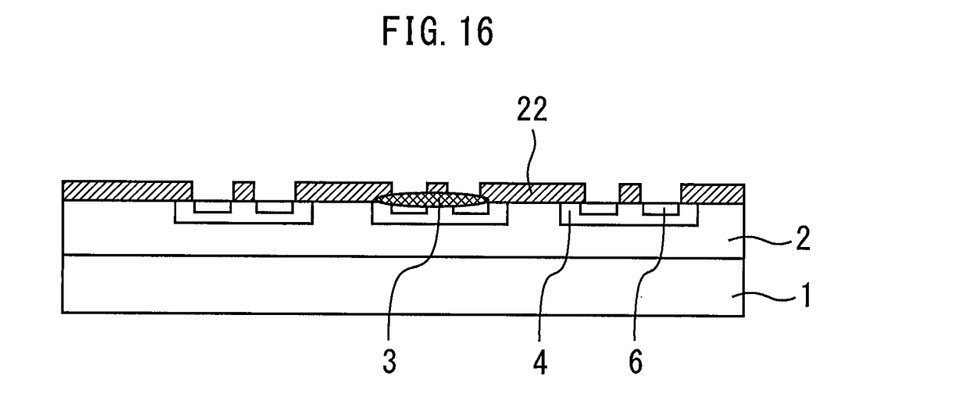
FIG. 16 is a cross-sectional view illustrating a method for manufacturing a semiconductor device according to a fifth embodiment.
Figure 17:
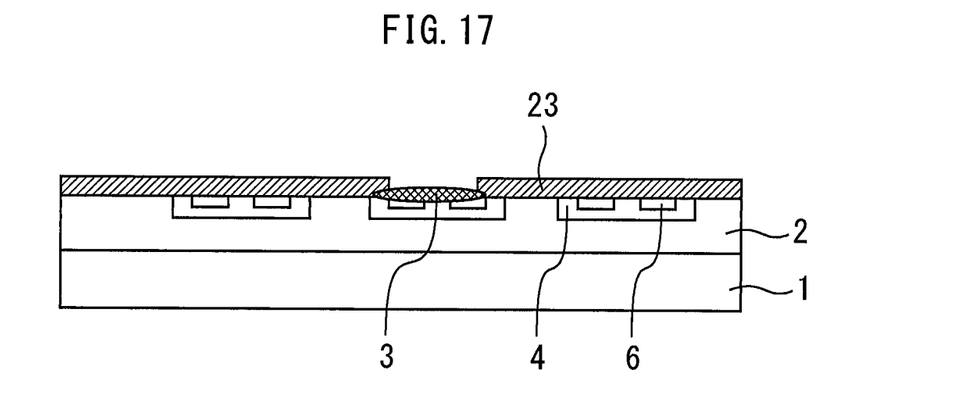
FIG. 17 is a cross-sectional view illustrating a method for manufacturing a semiconductor device according to a fifth embodiment.

FIG. 16 and FIG. 17 are cross-sectional views illustrating a method for manufacturing a semiconductor device according to a fifth embodiment. In a similar manner to the first embodiment, a crystal defect is inspected, and the well regions 4 are formed. Then, as illustrated in FIG. 16, the source regions 6 are respectively formed in a plurality of well regions 4 by injecting N using a normal resist pattern 22 in which regions where the source regions 6 are to be formed are open. At this time, the source regions 6 are formed in all the well regions 4 including the well region 4 in which the defect region 3 exists. Thereafter, the resist pattern 22 is removed.

Then, as illustrated in FIG. 17, a positive resist 23 is applied on the entire upper surface of the silicon carbide layer 2. The positive resist 23 in the defect region 3 is removed through exposure and development using mask-less exposure machine or a laser exposure machine. The source region 6 existing in the defect region 3 is canceled by injecting Al into the defect region 3 using this positive resist 23 as a mask. Because the source region 6 disappears from the defect region 3, it is possible to obtain effects similar to those of the first embodiment. Other configurations and effects are similar to those of the first embodiment.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-049005, filed on Mar. 19, 2020 including specification, claims, drawings and summary, on which the convention priority of the present application is based, is incorporated herein by reference in its entirety.

The invention claimed is:
1. A silicon carbide semiconductor device comprising:
a silicon carbide layer of a first conductive type including a defect region in which a crystal defect from epitaxial growth exists, the crystal defect having a length on the order of microns;
a plurality of well regions of a second conductive type formed on the silicon carbide layer;
source regions of the first conductive type formed in the well regions;
gate oxide films formed on the silicon carbide layer, the well regions and the source regions;
gate electrodes formed on the gate oxide films; and
a source electrode electrically connected to the well regions and the source regions,
wherein the source region is not formed in the defect region.

2. The silicon carbide semiconductor device according to claim 1, wherein
the crystal defect is a triangle defect.
3. The silicon carbide semiconductor device according to claim 1, wherein
the crystal defect is a downfall defect.
4. The silicon carbide semiconductor device according to claim 1, wherein
the crystal defect is a carrot defect.
5. The silicon carbide semiconductor device according to claim 1, wherein
every crystal defect in the silicon carbide semiconductor device is equal to or less than 100 µm in length.

\* \* \* \* \*